US008937483B2

(12) United States Patent
Jeong et al.

(10) Patent No.: US 8,937,483 B2
(45) Date of Patent: Jan. 20, 2015

(54) SEMICONDUCTOR PACKAGE TRANSFERRING APPARATUS AND METHOD OF MANUFACTURING SEMICONDUCTOR DEVICE USING THE SAME

(75) Inventors: Hyeck-Jin Jeong, Cheonan-si (KR); Yong-Ki Park, Cheonan-si (KR); Yong-Jin Jung, Asan-si (KR); Heul-Seog Kim, Asan-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 845 days.

(21) Appl. No.: 13/193,527

(22) Filed: Jul. 28, 2011

(65) Prior Publication Data
US 2012/0043253 A1 Feb. 23, 2012

(30) Foreign Application Priority Data

Aug. 23, 2010 (KR) .......................... 10-2010-0081612

(51) Int. Cl.
| | | |
|---|---|---|
| G01R 31/00 | (2006.01) | |
| G01R 31/10 | (2006.01) | |
| G01R 31/02 | (2006.01) | |
| F27D 5/00 | (2006.01) | |
| H01L 21/673 | (2006.01) | |

(52) U.S. Cl.
CPC .............................. H01L 21/67333 (2013.01)
USPC .................. 324/750.13; 324/750.1; 324/537; 432/253

(58) Field of Classification Search
CPC . G01R 31/2867; G01R 31/2865; G01R 31/02
USPC .......................... 324/750.13, 158.1, 760, 537
See application file for complete search history.

(56) References Cited

U.S. PATENT DOCUMENTS 4,222,737 A * 9/1980 Jones ............................. 432/253
5,418,692 A * 5/1995 Nemoto ......................... 361/809
(Continued)

FOREIGN PATENT DOCUMENTS

| KR | 20-2000-0002951 | 2/2000 |
|---|---|---|
| KR | 10-0292644 B1 | 2/2001 |

(Continued)

OTHER PUBLICATIONS

Translation of Korean Publication # 1020010028962 also listed as Application # 1019990041518.*

Primary Examiner — Jermele M Hollington
Assistant Examiner — Christopher McAndrew
(74) Attorney, Agent, or Firm — Muir Patent Consulting, PLLC

(57) ABSTRACT

A semiconductor package transferring apparatus is disclosed. The apparatus includes a tray that includes a front side and a rear side opposite the front side, the rear side including a plurality of package covering portions that each correspond to the shape of a semiconductor package and that are arranged to align with corresponding package loading portions on a front side of another tray. Each package covering portion has a surface configured to cover a semiconductor chip disposed below the surface. The apparatus further includes an anti-attachment portion disposed on the surface of one or more of the package covering portions. For each package covering portion on which an anti-attachment portion is disposed, the anti-attachment portion protrudes beyond the surface of the package covering portion.

14 Claims, 11 Drawing Sheets

(56) References Cited

U.S. PATENT DOCUMENTS

| | | | | |
|---|---|---|---|---|
| 6,036,023 | A * | 3/2000 | Pfahnl et al. | 206/725 |
| 6,097,201 | A * | 8/2000 | Slocum | 324/750.05 |
| 6,474,477 | B1 * | 11/2002 | Chang | 206/725 |
| 6,856,128 | B2 * | 2/2005 | Ito et al. | 324/750.13 |
| 7,163,104 | B2 * | 1/2007 | Inoke et al. | 206/726 |
| 7,374,970 | B2 * | 5/2008 | Takahashi | 438/113 |
| 7,757,862 | B2 * | 7/2010 | Tamura et al. | 206/725 |
| 7,829,990 | B1 * | 11/2010 | Scanlan et al. | 257/686 |
| 2007/0139048 | A1 * | 6/2007 | Koike | 324/426 |

FOREIGN PATENT DOCUMENTS

| | | | | |
|---|---|---|---|---|
| KR | 10-2001-0028962 A * | 4/2001 | | H01L 21/68 |
| KR | 10-0390324 B1 | 6/2003 | | |
| KR | 10-0481297 B1 | 3/2005 | | |
| KR | 10-2005-0091213 A | 9/2005 | | |
| KR | 10-2006-0023661 A | 3/2006 | | |
| KR | 10-0769926 B1 | 10/2007 | | |

* cited by examiner

SEMICONDUCTOR PACKAGE TRANSFERRING APPARATUS AND METHOD OF MANUFACTURING SEMICONDUCTOR DEVICE USING THE SAME

CROSS-REFERENCE TO RELATED APPLICATIONS

This U.S. non-provisional patent application claims priority under 35 U.S.C. §119 to Korean Patent Application No. 10-2010-0081612, filed on Aug. 23, 2010, the entire contents of which are hereby incorporated by reference.

BACKGROUND

The present disclosure relates to a transferring apparatus, and more particularly, to a semiconductor package transferring apparatus.

As a semiconductor product becomes lighter, thinner, shorter and smaller, a semiconductor package may not be easily detached from a semiconductor transferring apparatus occasionally due to a small amount of electrostatics. Accordingly, research and development for preventing a semiconductor package from being attached to a semiconductor package transferring apparatus is on demand.

SUMMARY

The present disclosure provides a semiconductor package transferring apparatus that assists in preventing a semiconductor package from being attached thereto.

In one embodiment, a semiconductor package transferring apparatus is disclosed. The apparatus includes a tray that includes a front side and a rear side opposite the front side, the rear side including a plurality of package covering portions that each correspond to the shape of a semiconductor package and that are arranged to align with corresponding package loading portions on a front side of another tray. Each package covering portion has a surface configured to cover a semiconductor chip disposed below the surface. The apparatus further includes an anti-attachment portion disposed on the surface of one or more of the package covering portions. For each package covering portion on which an anti-attachment portion is disposed, the anti-attachment portion protrudes beyond the surface of the package covering portion.

In another embodiment, a method of manufacturing a semiconductor device. The method includes forming a semiconductor package, the semiconductor package including a substrate, one or more chips, a molding, and one or more external connection terminals; placing the semiconductor package on a loading portion of a first tray; covering the semiconductor package with a package covering portion of a second tray; and transferring the semiconductor package using the first and second trays. The package covering portion includes an anti-attachment portion disposed on the surface of the package covering portion, wherein the anti-attachment portion protrudes beyond the surface of the package covering portion.

In a further embodiment, a method of manufacturing a semiconductor device is disclosed. The method includes receiving a semiconductor package from a plurality of stacked trays, the plurality of stacked trays including a first tray having a front side including a loading portion on which the semiconductor package is disposed, and a second tray having a rear side including a package covering portion aligned with the loading portion; separating the first tray from the second tray so that the semiconductor package remains in the first tray without electrostatically sticking to the second tray; removing the semiconductor package from the first tray; and performing one or more of: testing the semiconductor package, and attaching the semiconductor package to a chip, another package, or a board. The package covering portion includes an anti-attachment portion disposed on a surface of the package covering portion, wherein the anti-attachment portion protrudes beyond the surface of the package covering portion.

BRIEF DESCRIPTION OF THE DRAWINGS

The accompanying drawings are included to provide a further understanding of the disclosed embodiments, and are incorporated in and constitute a part of this specification. The drawings illustrate exemplary embodiments and, together with the description, serve to explain principles of the disclosure. In the drawings.

DETAILED DESCRIPTION OF THE EMBODIMENTS

Figure 1:
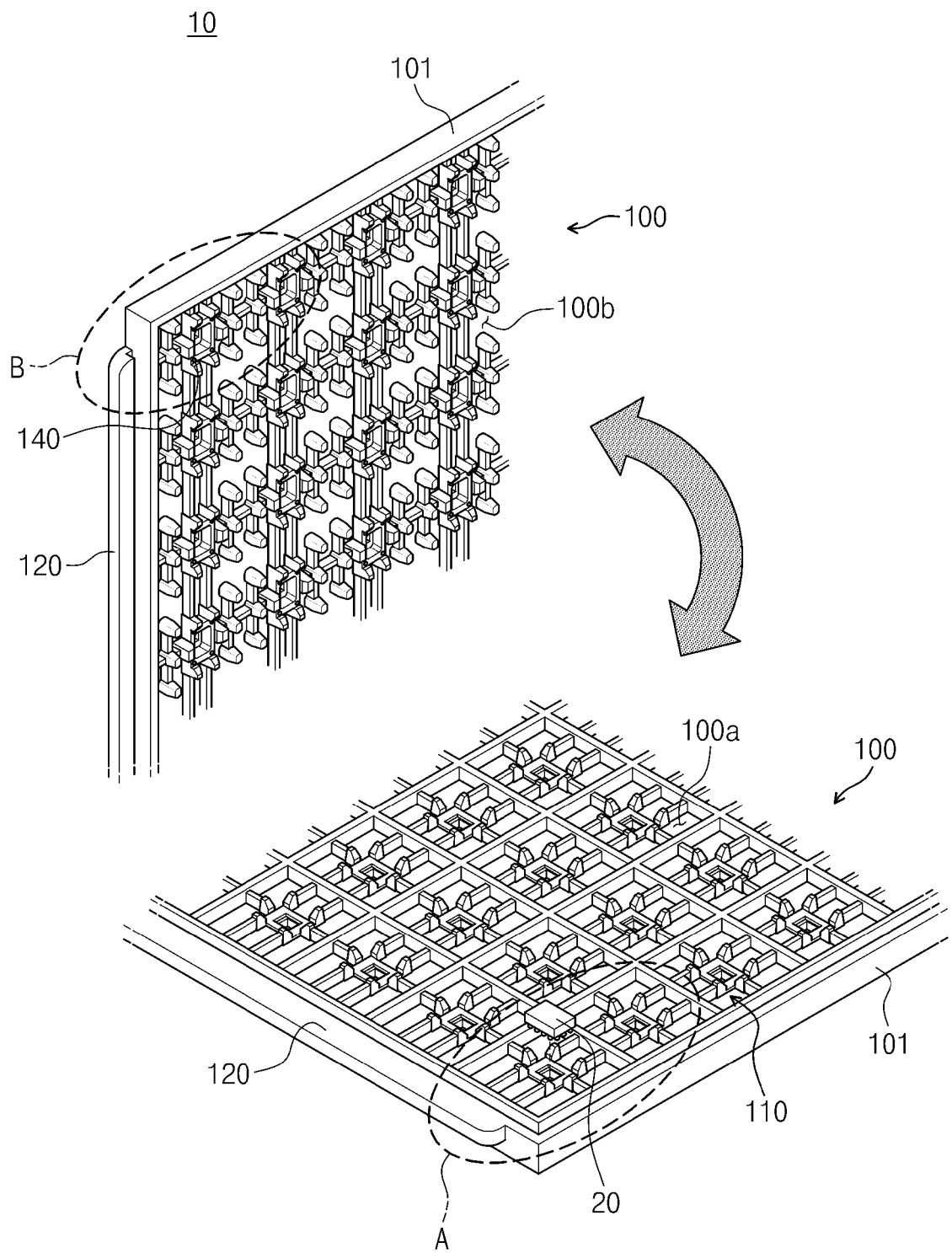
FIG. 1 is a perspective view illustrating a semiconductor package transferring apparatus according to certain exemplary embodiments.

Exemplary embodiments will be described below in more detail with reference to the accompanying drawings. The disclosed embodiments may, however, be embodied in different forms and should not be construed as limited to the embodiments set forth herein.

It will also be understood that when a device or layer is referred to as being "on" another device, layer, or substrate, it can be directly on the other device, layer, or substrate, or intervening devices, layers, or substrates may also be present. In the drawings, the thicknesses of layers and regions are exaggerated for clarity. Like reference numerals in the drawings denote like elements, and thus their description may be omitted.

Additionally, the embodiments in the detailed description will be described with sectional views as ideal exemplary views. In the figures, the dimensions of layers and regions are exaggerated for clarity of illustration, and the shapes of objects are depicted as having certain features (e.g., circular shapes, sharp corners, etc.). However, shapes of the exemplary views may be modified according to manufacturing techniques and/or allowable errors. Therefore, the disclosed embodiments are not limited to the specific shapes illustrated in the exemplary views, but may include other shapes that may be created according to manufacturing processes. Areas exemplified in the drawings have general properties, and are used to illustrate exemplary shapes of a semiconductor package region. However, the areas shown in the drawings are not intended to be limiting.

In the following description, technical terms are used for explaining specific embodiments while not limiting the disclosed embodiments. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Also, though terms like a first, a second, and a third are used to describe various elements, regions, and layers in various embodiments, the elements, regions, and the layers are not limited to these terms. Unless indicated as otherwise, these terms are used only to discriminate one element, region, or layer from another element, region, or layer.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, location, shapes, sizes, amounts, or other measures do not necessarily mean an exactly identical orientation, location, shape, size, amount, or other measure, but are intended to encompass nearly identical orientation, location, shapes, sizes, amounts, or other measures within acceptable variations that may occur, for example, due to manufacturing processes.

Hereinafter, exemplary embodiments will be described in detail with reference to the accompanying drawings.

[Semiconductor Package Transferring Apparatus—Embodiment 1]

Figure 2:
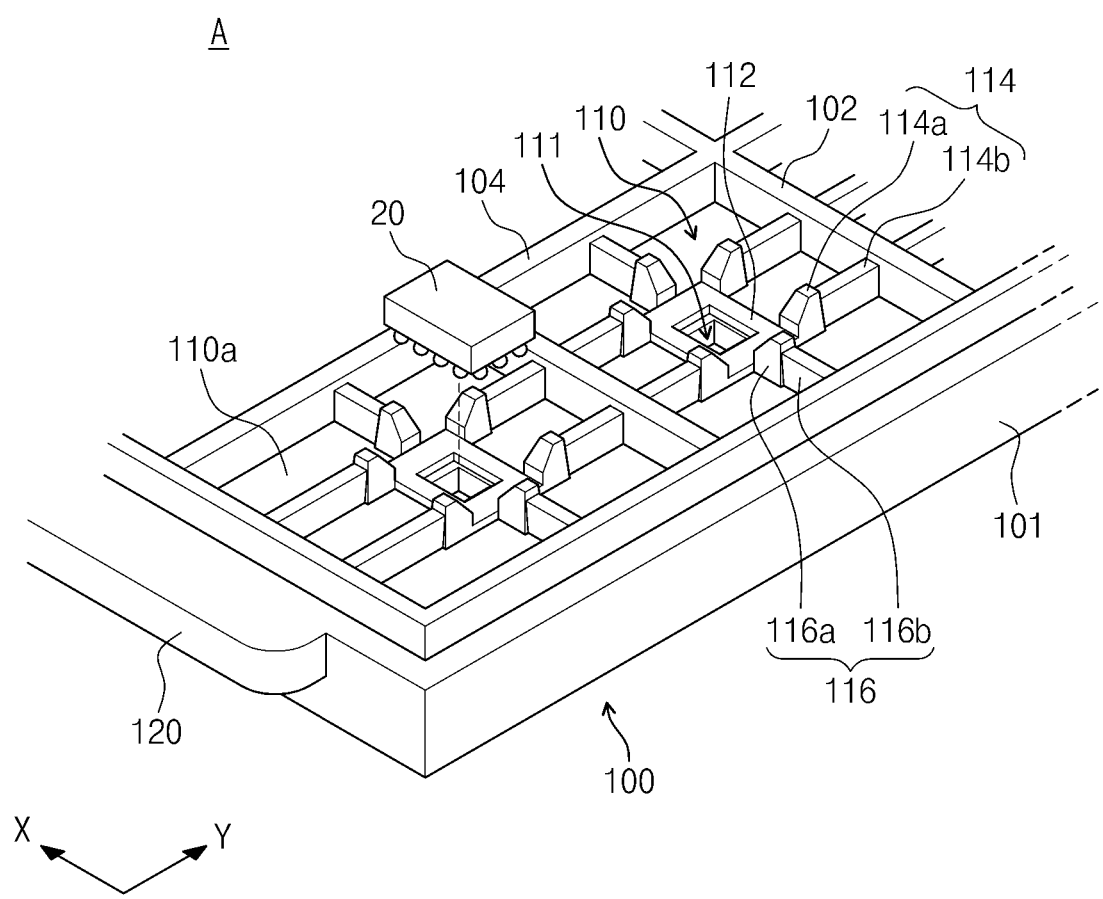
FIGS. 2 and 3 are enlarged views of a portion of the semiconductor package transferring apparatus of FIG. 1.
Figure 3:
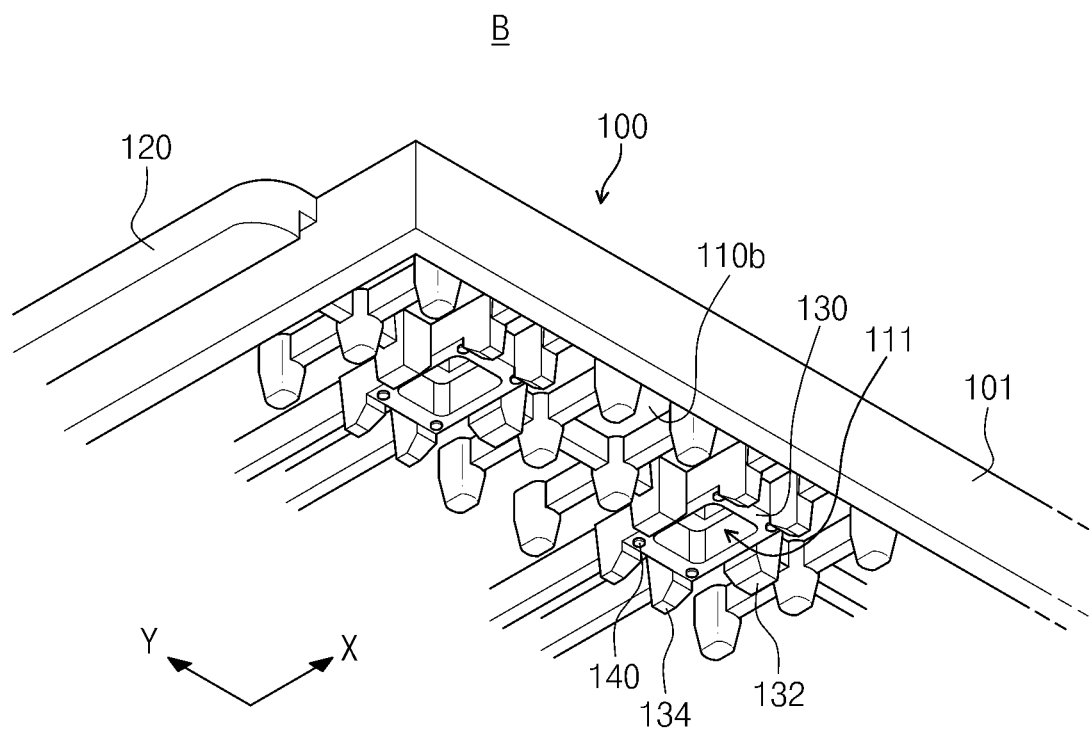
Figure 4:
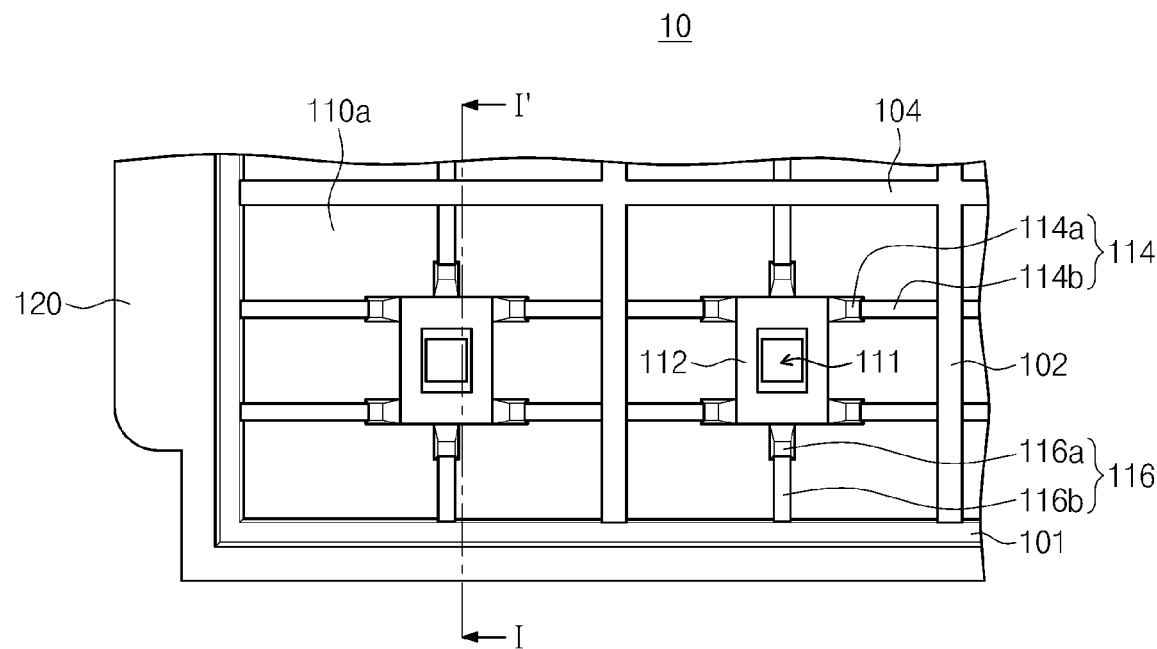
FIGS. 4 and 5 are enlarged plan views of a portion of the semiconductor package transferring apparatus of FIG. 1.
Figure 5:
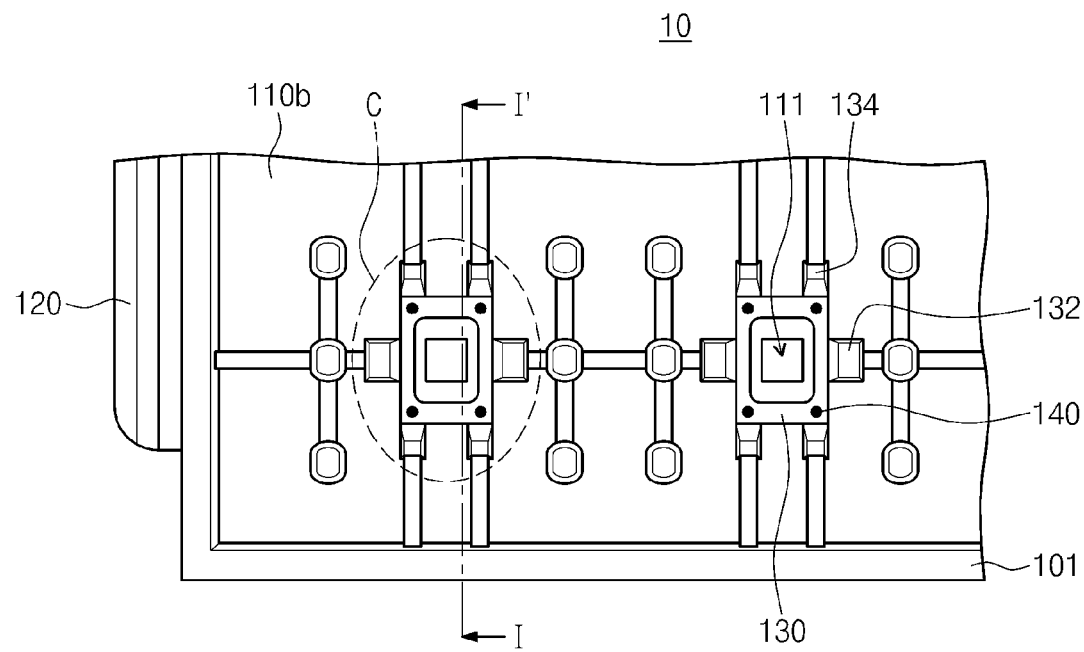
Figure 6:
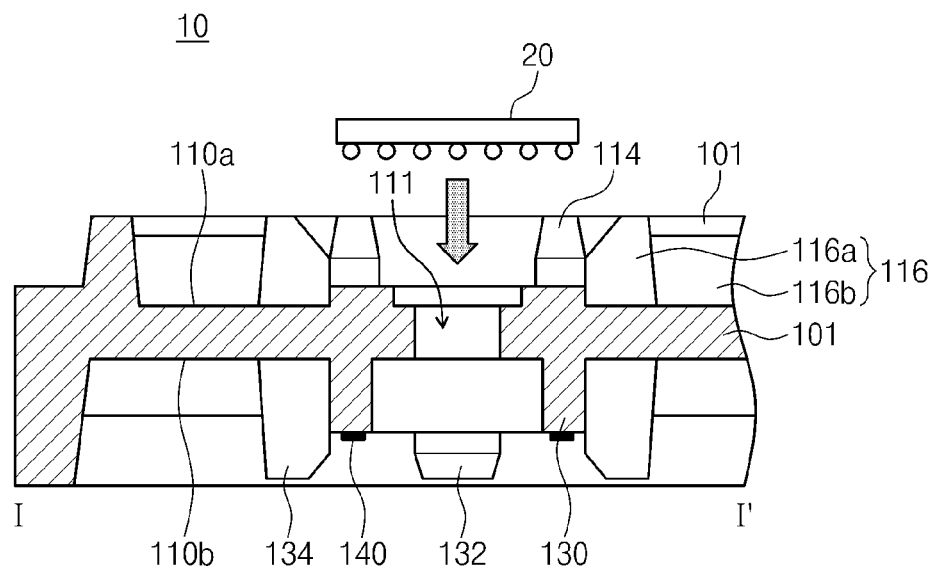
FIGS. 6 and 7 are enlarged sectional views of a portion of the semiconductor package transferring apparatus of FIG. 1.
Figure 7:
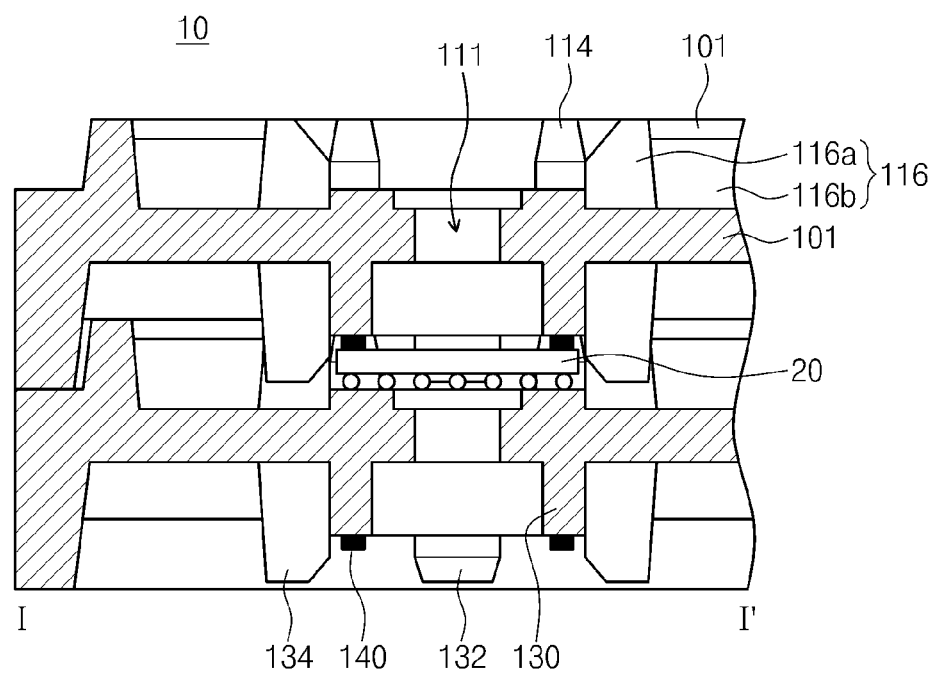

FIG. 1 is a perspective view illustrating a semiconductor package transferring apparatus according to certain exemplary embodiments. FIGS. 2 and 3 are enlarged views of a portion of the semiconductor package transferring apparatus of FIG. 1. FIGS. 4 and 5 are enlarged plan views of a portion of the semiconductor package transferring apparatus of FIG. 1. FIGS. 6 and 7 are enlarged cross-sectional views of a portion of the semiconductor package transferring apparatus of FIG. 1.

FIGS. 2 and 4 are a perspective view and a plan view of an enlarged portion A of the semiconductor package transferring apparatus of FIG. 1, respectively. FIGS. 3 and 5 are a perspective view and a plan view of an enlarged portion B of the semiconductor package transferring apparatus of FIG. 1. FIG. 6 is a cross-sectional view taken along the line I-I' of the semiconductor package transferring apparatus of FIGS. 4 and 5. FIG. 7 is a cross-sectional view illustrating a tray-stacked structure of the semiconductor package transferring apparatus of FIGS. 4 and 5.

Referring to FIG. 1, the semiconductor package transferring apparatus 10 may include a plurality of trays. The plurality of trays 100 may be identical trays vertically stackable on each other such that a front of a first tray (e.g., a front side or front surface) connects with a rear of a second tray (e.g., a rear side or a rear surface), a front of the second tray connects with a rear of a third tray, etc. To describe an exemplary stacking between trays, two trays 100 are exemplarily described below.

Each tray 100 may include a body 101 having a first side 100a (e.g., a front) and a second side 100b opposite the first side (e.g., a rear). The first side 100a may serve to receive semiconductor packages for transport, and the second side 100b may serve to cover semiconductor packages received in another tray during transport of the semiconductor packages. As such, a plurality of trays can be stacked on each other to transport a plurality of semiconductor packages.

In one embodiment, the trays are used to transport semiconductor packages (which may include, for example, a package substrate connected to a single semiconductor chip, a package substrate connected to a stack of semiconductor chips, a package-on-package device, etc.), after the packages have been formed during a manufacturing process that includes forming the layers and circuitry of the package, molding the package, attaching solder balls or other terminals for external connection, and separating the package from other packages using sawing or another process (e.g., if the package was created together with other packages, for example on a wafer substrate). For example, the trays may transport packages to a different location for testing, or to be combined with one or more additional chips, packages, boards, modules, etc.

In one embodiment, the front of each tray includes a plurality of pocket portions 110 for receiving semiconductor packages 20, and the rear of each tray includes an anti-attachment portion 140 that assists in preventing semiconductor packages from sticking to the rear surface when the trays are separated after transport.

The body 101 may have an overall rectangular plate form. Referring to FIGS. 2 and 4, the front of the body 101 may include first extension axes 102 extending in an x-axis direction and second extension axes 104 extending in a y-axis direction. According to certain embodiments, the first extension axes 102 and the second extension axes 104 are raised above a floor surface 110a of a pocket portion 110 on the front of the body 101, and intersect each other, thereby defining spaces for the pocket portions 110 in the body 101, and separating different pocket portions 110.

Referring to FIGS. 3 and 5, the rear of the body 101 may have a structure corresponding to the front of the body 101. As such, according to certain embodiments, the rear of a second tray may be vertically stacked on the front of a first tray, and a plurality of packages may be housed therebetween. For example, the rear of a second tray corresponding to a protruding portion at the front of a first tray may have a recess portion.

In one embodiment, a handle 120 for moving the tray 100 may be disposed at the side of the body 101. The handle 120 may extend away from the body 101 to a side direction. According to certain embodiments, the handle 120 and the body may be integrated as a single structure.

The pocket portions 110 may be formed on the body 101 and may include a floor portion 110a, raised portions, and a through holes, described further below. As described above, according to certain embodiments, the pocket portions 110 may be formed in spaces defined by the first extension axes 102 and the second extension axes 104. Seen from the top view, the pocket portion 110 may have an overall rectangular shape.

Referring to FIGS. 2 and 4, a loading portion 112 into which each semiconductor package is loaded may be formed at the front of the body 101 for each pocket 110. Seen from the top view, in one embodiment, the loading portion 112 may be raised above the level of the floor portion 110a of the pocket portion 110, and may have a rectangular shape with an x-axis direction as a major axis direction. The loading portion 112 may additionally have a through hole 111 penetrating its center. Accordingly, in one embodiment, the loading portion 112 has a closed loop structure surrounding the through hole 111. In one embodiment, a width of an upper-most surface of the loading portion 112 around the closed loop may be the same. According to certain embodiments, the top of the through hole 111 (e.g., at a vertical location coplanar with the upper-most surface of the loading portion 112) may have a greater width than a width of the through hole 111 below the top. Due to the width difference between the top and a lower portion of the through hole 111, a step portion may be formed on a sidewall of the through hole 111. Since the through hole 111 is formed in the loading portion 112, an area of contact between that the pocket portion 110 and the semiconductor package 20 may be reduced.

In one embodiment, the pocket portion 110 includes first protruding portions 114 extending from a side parallel to the major axis (e.g., x-axis) of the loading portion 112 to the first extension axis 102 and a second protruding portion 116 extending from a side parallel to the minor axis (e.g., y-axis) of the loading portion 112 to the second extension axis 104. The first protruding portions 114 and the second protruding portions 116 may be raised a certain height above the floor 110a of the pocket portion 110, that is higher than the height of the upper-most surface of the loading portion 112. The first protruding portions 114 and the second protruding portions 116 may serve to guide the semiconductor package 20 into the loading portion 112. Additionally, the plurality of trays 100 may be vertically stacked and fixed by the first protruding portions 114 and the second protruding portions 116.

The first protruding portions 114 may be spaced apart from each other. According one embodiment, if the first protruding portions 114 are two, the first protruding portions 114 are disposed at both sides of the loading portion 112 parallel to the major axis of the loading portion 112. According to another embodiment, each first protruding portion 114 may include a first portion 114a disposed directly adjacent to the loading portion 112 and having a first height, and a second portion 114b extending from the first portion 114a to be adjacent to the first extension axis 102 and having a second height lower than the first height. In one embodiment, both heights are greater than the height at the upper-most surface of the loading portion 112. In one embodiment, the top surface of the first portion 114a may have a downward slope lowered toward the loading portion 112.

The second protruding portion 116 may be disposed at the middle of a side of the loading portion 112 parallel to the minor axis. According to one embodiment, the second protruding portion 116 may include a third portion 116a disposed directly adjacent to the loading portion 112 and having a first height, and a fourth portion 116b extending from the third portion to be disposed adjacent to the second extension axis 104 and having a second height. The second height may be lower than the first height, and both heights may be greater than the height at the upper-most surface of the loading portion 112. The top surface of the third portion 116a may have a downward slope lowered toward the loading portion 112. In one embodiment, the height of the first portion 114a of the first protruding portion 114 may be the same as the height of the third portion 116a of the second protruding portion 116, and the height of the second portion 114b of the first protruding portion 114 may be the same as the height of the fourth portion 116b of the second protruding portion 116.

Referring to FIGS. 3 and 5, a portion 130 corresponding to the loading portion 112 at the front of the pocket portion 110 may be formed at the rear of the body 101. In one embodiment, the portion 130 is a rectangular portion 130 that has an x-axis as a major axis. However, if packages that have non-rectangular shapes are used, the portion 130, as well as the loading portion 112 can have corresponding non-rectangular shapes. The portion 130 may be referred to as a package covering portion. As mentioned above, since the package covering portion 130 has a through hole 111 penetrating its center, it may form a closed loop (e.g., having a ring shape). The width at a surface of the closed loop may be substantially the same around the closed loop.

The rear of the body 101 corresponding to the pocket portion 110 may have a structure corresponding to the first protruding portions 114 and the second protruding portions 116. Accordingly, the rear of the body 101 corresponding to the pocket portion 110 may include a third protruding portion 132 disposed between the first protruding portions 114 at the front and fourth protruding portions 134 disposed at both sides of the second protruding portion 116 at the front. The third protruding portion 132 and fourth protruding portion 134 may extend a certain distance below the ceiling 110b of the rear of the body 101. When a plurality of trays are stacked vertically, the third protruding portion 132 is inserted between the first protruding portions 114 and the second protruding portion 116 is inserted between the fourth protruding portions 134, thereby stacking and fixing the trays 100.

Referring to FIGS. 1, 6, and 7, a plurality of trays 100 may be stacked. The rear of the upper tray 100 may be stacked on the front of the lower tray 100. As described above, the loading portions 112 of the lower tray 100 have a structure corresponding to that of the rectangular portions 130 of the upper tray 100, so that the plurality of trays 100 may be stacked.

A space defined by the loading portion 112 and the rectangular portion 130 may be provided between the top of the lower tray 100 and the bottom of the upper tray 100. A semiconductor package 20 may be inserted into the space. In more detail, the plurality of semiconductor packages 20 may be disposed in the pocket portions 110 at the top surface of the lower tray 100. The upper tray 100 may be stacked on the top surface of the lower tray where the plurality of semiconductor packages 20 are disposed. As such, the front of the lower tray at loading portions 112 of the pocket portions 110 and the rear of the upper tray at package covering portions 130 are disposed around the plurality of semiconductor packages 20. In one embodiment, the bottom of the package (e.g., solder balls on the bottom of the package) contacts a top surface of the loading portion 112 of a lower tray, and the top of the package contacts an anti-attachment portion on the rear of an upper tray.

When the plurality of trays 100 are vertically stacked, an anti-attachment portion 140 may prevent the top surface of the semiconductor package 20 from being attached to the bottom surface of the tray 100 after the trays are later separated.

Figure 8:
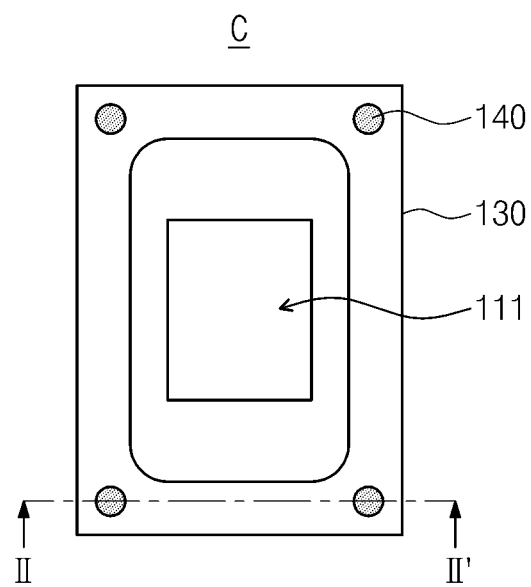
FIGS. 8 through 12 are plan views illustrating a semiconductor package transferring apparatus according to certain exemplary embodiments.
Figure 9:
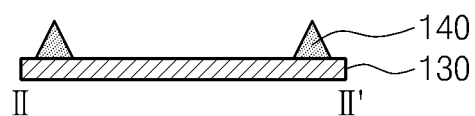
Figure 10:
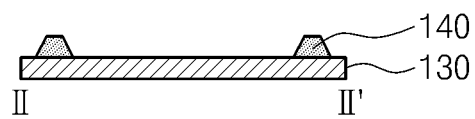
Figure 11:
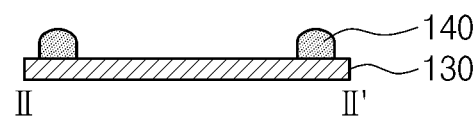
Figure 12:
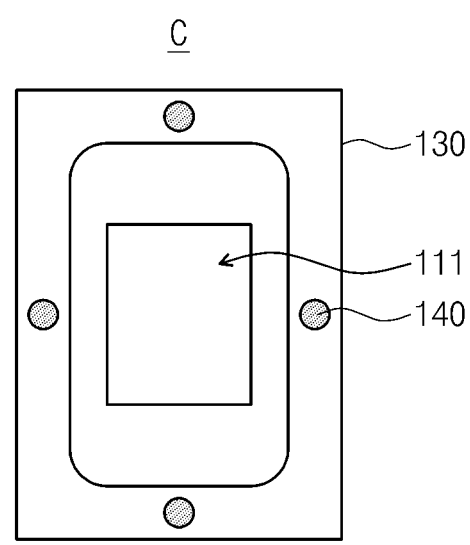

FIGS. 8 through 12 are plan views illustrating a semiconductor package transferring apparatus according to exemplary embodiments. FIGS. 8 and 12 are enlarged plan views illustrating a portion C of FIG. 5. FIGS. 9 through 11 are cross-sectional views taken along the line II-II' of the semiconductor transferring apparatus of FIG. 8.

Referring to FIGS. 8 through 12, an anti-attachment portion 140 may be disposed on the surface of a rectangular portion on a rear of a tray corresponding to a pocket portion on the front of the tray. Anti-attachment portion 140 may include a plurality of protrusions that are separated from each other. As discussed herein, each separate protrusion that is part of the anti-attachment portion may be referred to as a "node." In one embodiment, protrusions may be point-shaped, and the cross-sectional shape of each protrusion 140 may have a particular shape, such as polygonal or semicircular shape, as shown in FIGS. 9-11. According to one embodiment described with reference to FIG. 8, the protrusions 140 may be disposed at corner portions of the rectangular portion 130 (i.e., adjacent the corners of the package covering portion 130). As one example, the four protrusions 140 may be disposed at the respective corners. According to another embodiment described with reference to FIG. 12, the protrusions 140 may be disposed at a major axis and a minor axis of the package covering portion 130, respectively (e.g., in center portions of the sides of the package covering portion 130). As one example, each of the four protrusions 140 may be disposed at a center of a respective side or package covering portion 130. However, the inventive concept does not limit a shape, location, or quantity of protrusions (i.e., nodes) included in the anti-attachment portion 140.

According to one embodiment, the anti-attachment portion 140 may be separately disposed on the surface of the package covering portion 130 of the pocket portion 110, for example, to include a different material formed separately from the package covering portion 130. According to another embodiment, the anti-attachment portion 140 and the package covering portion 130 of the pocket portion 110 may be integrated into one body, for example, made of the same material and formed at the same time.

In one embodiment, the anti-attachment portion 140 prevents the semiconductor package 20 from being attached to the rear of the tray 100. In more detail, the anti-attachment portion 140 may prevent the top surface of the semiconductor package 20 loaded into the loading portion 112 from being attached to the package covering portion 130 of the upper tray 100. This is because the anti-attachment portion 140 is disposed at the package covering portion 130 of the tray 100 so that an area that the top surface of the semiconductor package 20 contacts is reduced. As an area of the top surface of the semiconductor package 20 contacting the tray 100 is reduced, attraction between the top surface of the semiconductor package 20 and the rear of tray 100 is be reduced. Accordingly, the top surface of the semiconductor package 20 is less likely to be and may be prevented from being attached to the rear of the tray 100.

[Semiconductor Package Transferring Apparatus—Embodiment 2]

Figure 13:
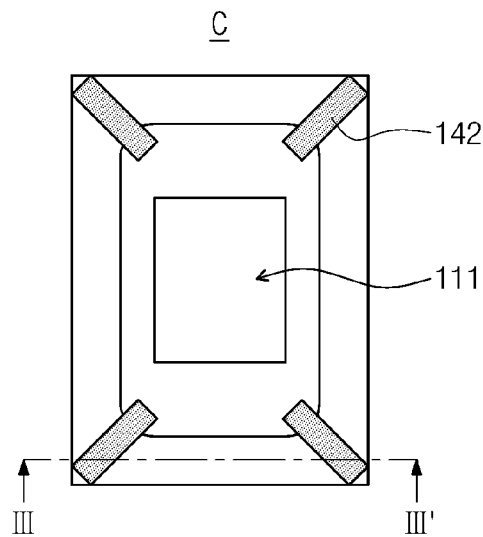
FIGS. 13 through 15 are plan views and a sectional view illustrating a semiconductor package transferring apparatus according to another exemplary embodiment.
Figure 14:
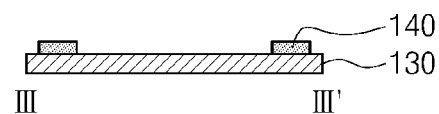
Figure 15:
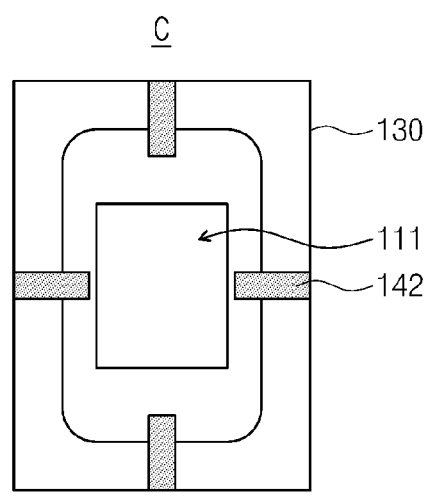

FIGS. 13 through 15 are plan views and a cross-sectional view illustrating a semiconductor package transferring apparatus according to another exemplary embodiment. FIGS. 13 and 15 are plan views illustrating an anti-attachment layer of the semiconductor package transferring apparatus according to certain embodiments. FIG. 14 is a cross-sectional view taken along the line III-III' of the semiconductor package transferring apparatus of FIG. 13.

Referring to FIGS. 1, 13 through 15, the semiconductor package transferring device 10 may include trays 100. Each tray 100 may include a plurality of pocket portions 110 and an anti-attachment portion 142. In one embodiment, the trays 100, body 101, and pocket portions 110 are substantially identical to those 100, 101, and 110 of FIGS. 1 through 7 in the first embodiment, and thus an detailed description thereof will be omitted.

Referring to FIGS. 13 through 15, the anti-attachment portion 142 may be disposed on the surface of a rectangular portion 130. According to certain embodiments, the anti-attachment portion 142 may include bar-shaped patterns (i.e., nodes) 142 protruding above the surface of the rectangular portion 130. Each pattern 142 may have a bar shape extending, for example, from the edge of the rectangular portion 130 toward a through hole 111. In one embodiment, for each pattern 142, one end of the bar shape is adjacent a corner of the rectangular portion 130, and another end of the bar shape extends past an inner edge of the lower-most surface of the rectangular portion 130 over the through-hole. Accordingly, the patterns 142 may partially overlap the through hole 111.

According to one embodiment described with reference to FIG. 13, the patterns 142 may be disposed at the corners of the rectangular portion 130. According to another embodiment described with reference to FIG. 15, the patterns 142 may be disposed on a central portion of the sides of rectangular portion 130. As one example, each of the four patterns 142 may be disposed at a center of a respective side of rectangular portion 130, and may extend from an outer edge of the side toward and past an inner edge of the rectangular portion 130 to partially overlap the through hole 111.

However, the disclosed embodiments are not limited to the shape, position, orientation, or quantity of the anti-attachment portions 142 shown in FIGS. 13 and 15.

According to one embodiment, the anti-attachment portion 142 may be separately disposed on the surface of the rectangular portion 130. According to another embodiment, the anti-attachment portion 142 and the rectangular portion 130 may be integrated into one body.

[Semiconductor Package Transferring Apparatus—Embodiment 3]

Figure 16:
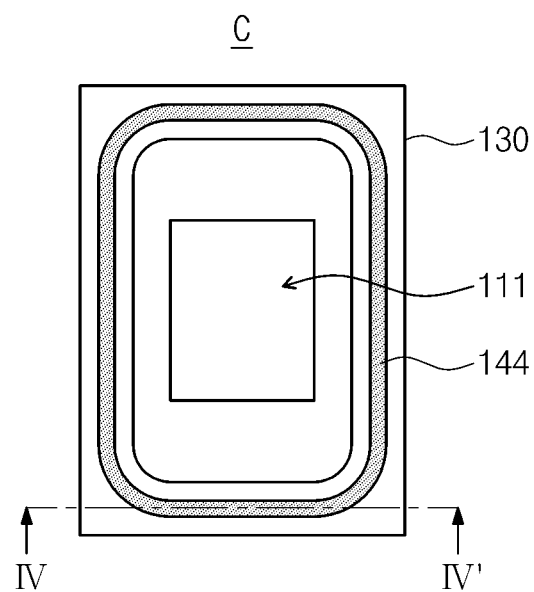
FIGS. 16 and 17 are a plan view and a sectional view illustrating a semiconductor package transferring apparatus according to a further exemplary embodiment.
Figure 17:
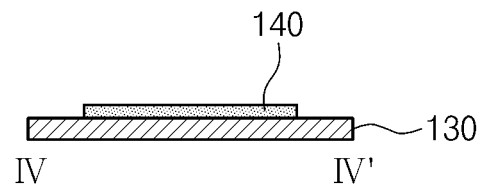

FIGS. 16 and 17 are a plan view and a cross-sectional view illustrating a semiconductor package transferring apparatus according to another embodiment. FIG. 16 is a plan view illustrating an anti-attachment layer of the semiconductor package transferring apparatus according to one embodiment. FIG. 17 is a cross-sectional view taken along the line IV-IV' of the semiconductor package transferring apparatus of FIG. 16.

Referring to FIGS. 1, 16 and 17, the semiconductor package transferring device 10 may include trays 100. Each tray 100 may include a body 101, a plurality of pocket portions 110 and an anti-attachment portion 144. In one embodiment, the trays 100, body 101, and pocket portions 110 are substantially identical to those 100, 101, and 110 of FIGS. 1 through 7 in the first embodiment, and thus a detailed description thereof will be omitted.

Referring to FIGS. 16 to 17, the anti-attachment portion 144 may be disposed on the surface of a rectangular portion 130. According to certain embodiments, the anti-attachment portion 144 may have a closed loop (i.e., ring) shape extending continuously along the shape of the rectangular portion 130. However, a closed loop shape is not required, and the anti-attachment portion 144 may include breaks such that it has a general shape such as shown in FIG. 16, but has a plurality of separated nodes and therefore is not a closed loop. In addition, although the corners of anti-attachment portion 144 are shown as being rounded, they may be angular. Further, although the sides of anti-attachment portion 144 are shown as straight, they may be curved, or may have a wave-like shape to form the ring shape. In one embodiment, the width of the surface of anti-attachment portion 144 may be substantially less than that of the rectangular portion 130 (e.g., less than 50%, or 30% the width of the surface of rectangular portion 130).

According to one embodiment, the anti-attachment portion 144 may be separately disposed on the surface of the rectangular portion 130 of the pocket portion 110. According to another embodiment, the anti-attachment portion 144 and the rectangular portion 130 of the pocket portion 110 may be integrated into one body.

[Semiconductor Package Transferring Apparatus—Embodiment 4]

Figure 18:
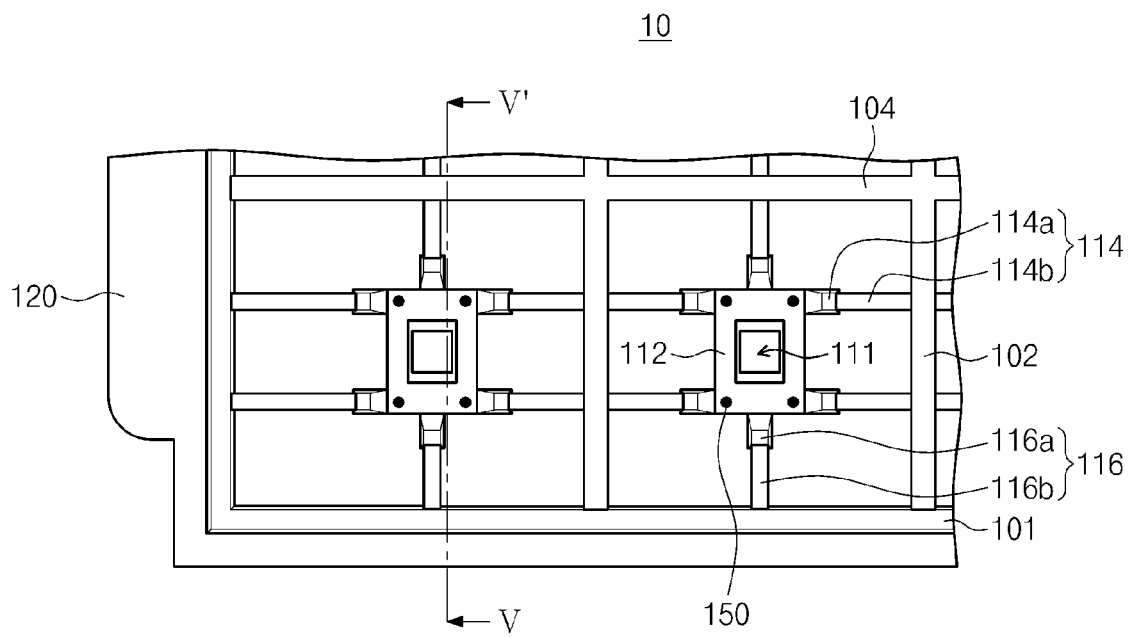
FIGS. 18 and 19 are a plan view and a sectional view illustrating a semiconductor package transferring apparatus according to another exemplary embodiment.
Figure 19:
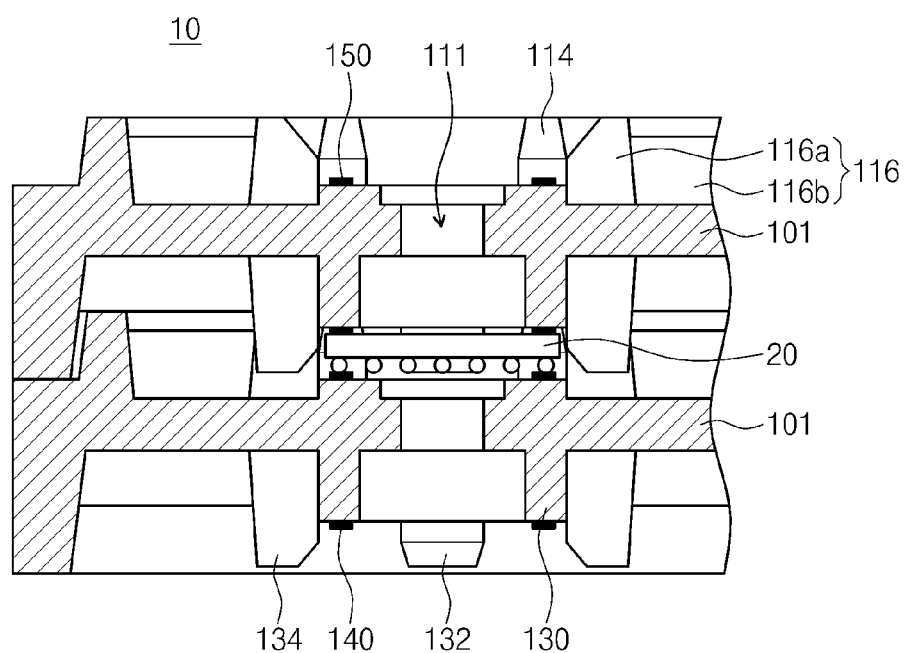

FIGS. 18 and 19 are a plan view and a cross-sectional view illustrating a semiconductor package transferring apparatus according to another embodiment. FIG. 19 is a cross-sectional view taken along the line V-V' of the semiconductor package transferring apparatus of FIG. 18.

Referring to FIGS. 18 and 19, the semiconductor package transferring device 10 includes trays 100. Each tray 100 may include a body 101, a plurality of pocket portions 110, a first anti-attachment portion 140, and a second anti-attachment portion 150.

A loading portion 112 is formed at the front of the pocket portion 110 and a package covering portion 130 is formed at the rear. The first anti-attachment portion 140 may be disposed at the package covering portion 130 of the pocket portion 110. In one embodiment, the trays 100, body 101, pocket portions 110, and first anti-attachment portion are substantially identical to those discussed in FIGS. 1-17 previously, and thus a detailed description thereof will be omitted.

The second anti-attachment portion 150 may be disposed on the surface of the loading portion 112 of the pocket portion 110. According to exemplary embodiments, the second anti-attachment portion 150 may have the same shape and structure as any of the first anti-attachment portions 140, 142, or 144 discussed above. More specifically, in one embodiment, the second anti-attachment portion 150 may include a plurality of protrusions 150 disposed at the surface of the loading portion 112. A cross-section of each protrusion may have a polygonal or semicircular shape. According to one embodiment, the protrusions may be disposed at corners of the loading portion 112. As one example, four protrusions are disposed at the respective corners. According to another embodiment, the protrusions 150 may be disposed along sides of the package covering portion 130, respectively, or may be formed in a closed loop that follows package covering portion 130. However, the disclosed embodiments are not limited to a shape, orientation, location, or quantity of the anti-attachment portions described above.

According to one embodiment, the second anti-attachment portion 150 may be separately disposed on the surface of the loading portion 112 of the pocket portion 110. According to another embodiment, the second anti-attachment portion 150 and the loading portion 112 of the pocket portion 110 may be integrated into one body. For a given tray, the second anti-attachment portion 150 may have the same or a different configuration as the first anti-attachment portion. For example, the second anti-attachment portion 150 may include four nodes, which may be point-shaped protrusions, while the first anti-attachment portion includes four bar-shaped protrusions, or vice versa. Or, both anti-attachment portions can have the same number and type of nodes place in the same locations. Other arrangements may be used as well.

The second anti-attachment portion 150 may prevent the semiconductor package 20 from being attached to the front of the tray 100. In more detail, the second anti-attachment portion 150 may prevent the semiconductor package 20 loaded into the loading portion 112 from being attached to the loading portion 112 after an upper tray and lower tray are separated. This is because the second anti-attachment portion 150 is disposed at the loading portion 112 of the tray 100 so that an area that the rear of the semiconductor package 20 contacts may be reduced. As an area that the rear of the semiconductor package 20 contacts the tray 100 is reduced, attraction between the rear of the semiconductor package 20 and the top surface the tray 100 may be reduced. Accordingly, the bottom surface of the semiconductor package 20 may be prevented from being attached to the top of the tray 100.

Figure 20:
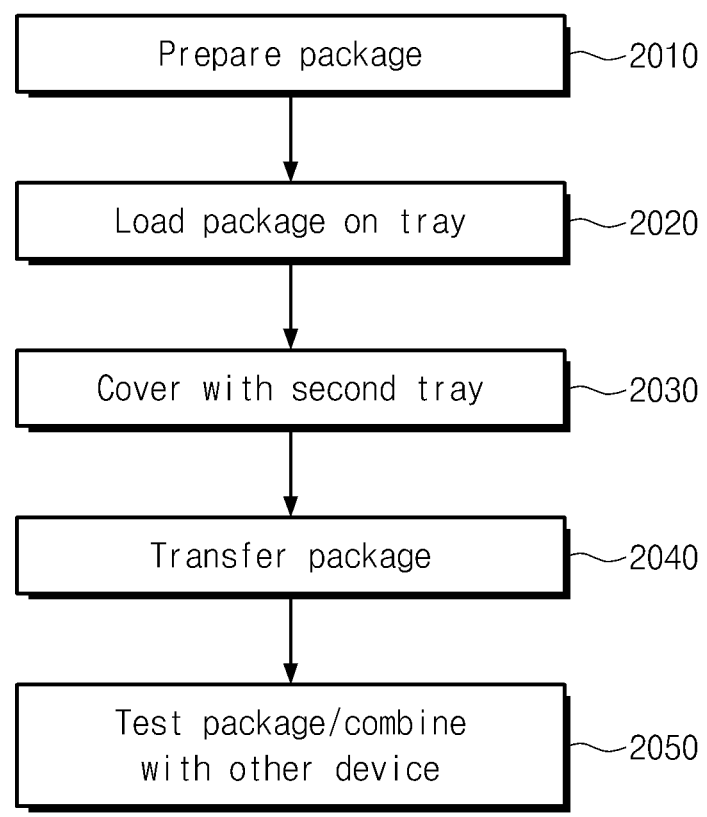
FIG. 20 is a flowchart of an exemplary method of manufacturing a semiconductor device, according to certain embodiments.

Next, a method of manufacturing a semiconductor device using a tray such as described in FIGS. 1-19 will be discussed in connection with FIG. 20. FIG. 20 depicts an exemplary method of manufacturing a semiconductor device in accordance with certain embodiments. The semiconductor device may be, for example, a semiconductor package, or a system, including a semiconductor package connected to a circuit board or other substrate. For example, the semiconductor device could be part of a semiconductor memory module, a memory card, a controller, or other component of an electronic device. The semiconductor device could be used in a system such as a cell phone, a PDA, a laptop computer, a removable memory, a personal media player, etc.

In step 2010, a semiconductor package is prepared. The package may be package 20 such as described above in connection with FIGS. 1-19, and in one embodiment includes a package substrate and one or more semiconductor chips, a molding, and a plurality of terminals (e.g., solder balls) for external connections to external devices. In one embodiment, the package is prepared by forming the one or more chips on the substrate, making appropriate electrical connections between the one or more chips and the substrate, forming a mold over the one or more chips and the substrate, and forming the plurality of terminals that serve as external connections.

Next, in step 2020, a prepared package is loaded on a first tray, such as tray 100 described above in FIGS. 1-19. In one embodiment, the package has a shape (e.g., rectangular) that fits into a loading portion (e.g., loading portion 112) on the front of a tray. In one embodiment, a bottom of the chip, such as connection terminals at the bottom of the chip, may be placed in contact with an upper surface of the loading portion. The package may be guided into the loading portion with the assistance of protruding portions (e.g., protruding portions 114 and 116) on the front of the tray. In one embodiment, each package loaded onto a loading portion of the tray is loaded using a robot arm having, for example, vacuum suction capabilities to lift and release packages, and programmed using X, Y, and Z coordinates to place the package onto the tray. In one embodiment, a plurality of packages may be loaded onto a tray using this procedure.

In step 2030, after one or more packages have been loaded onto a first tray, an additional, second tray, such as tray 100 described in FIGS. 1-19 above, may be placed over the first tray, to secure the packages for transport. For example, a rear of the second tray may be placed over the front of the first tray, such that package covering portions on the rear of the second tray align with the loading portions on the front of the first tray. The trays may be lifted and released using a handle, such as handle 120 described in FIGS. 1-19. In one embodiment, the package covering portions on the rear of the second tray and/or the loading portion on the front of the first tray include anti-attachment portions, such as described above in connection with FIGS. 1-19. In a further embodiment, the second tray may have a front having loading portions, and additional packages may be loaded onto the second tray. A third tray may then cover the second tray. Additional packages and trays may continue to be loaded.

After all the desired packages and trays have been stacked together, the stack of trays and the one or more packages are transferred (step 2040) to a different location. For example, the stack of trays may be transferred to a testing facility where testing of the packages can be performed, or may be transferred to a facility where the packages will be combined with additional chips, packages, and/or boards to be made into a semiconductor device. After being received, the trays may be sequentially removed and the packages may be removed as well, using, for example, a robot arm and vacuum suction for lifting. Because the trays include one or more anti-attachment portions, the packages are prevented from sticking to the rear of the upper trays and/or the front of the lower trays due to static electricity.

In step 2050, a further step in the manufacturing process of the semiconductor device is performed. For example, in one embodiment, the step includes testing the one or more packages transferred by the trays. For example, each of the transferred packages may be received at a testing facility and are then tested before being optionally placed into another (or the same) tray for transfer to a subsequent step in the manufacturing process. The subsequent step may include, for example, combining the package with additional chips, packages, and/or boards to form a semiconductor device. The semiconductor device may be, for example, a package-on-package device, a semiconductor module (e.g., memory module including a board and one or more packages), or another device that includes the package. In one embodiment, the subsequent step may be performed without first performing testing.

According to embodiments discussed above, since an anti-attachment unit is disposed at the rear and optionally the front of each tray, a semiconductor package loaded into a tray is prevented from being attached to the rear (or the front) of the tray.

Additionally, since an area where the tray and the semiconductor package contact is reduced by an anti-attachment unit, foreign materials may be prevented from being attached to the semiconductor package.

The above-disclosed subject matter is to be considered illustrative and not restrictive, and the appended claims are intended to cover all such modifications, enhancements, and other embodiments, which fall within the true spirit and scope of the disclosed embodiments. Thus, the invention is to be determined by the broadest permissible interpretation of the following claims and their equivalents, and shall not be restricted or limited by the foregoing detailed description.

What is claimed is:

1. A semiconductor package transferring apparatus, comprising:
   a tray that includes a front side and a rear side opposite the front side, the rear side including:
   a plurality of package covering portions that each correspond to the shape of a semiconductor package and that are arranged to align with corresponding package loading portions on a front side of another tray, wherein each package covering portion has a surface configured to cover a semiconductor package disposed below the surface;
   for each package covering portion, a plurality of protruding portions disposed outside of the package covering portion, the plurality of protruding portions configured to fix rear side of the tray to a front side of another tray;
   an anti-attachment portion disposed on the surface of one or more of the package covering portions, wherein for each package covering portion on which an anti-attachment portion is disposed, the anti-attachment portion protrudes vertically beyond the surface of the package covering portion, and is separate from and positioned inside a boundary formed by the plurality of protruding portions,
   wherein for each package covering portion, the anti-attachment portion is positioned to be within outer boundaries of a semiconductor package placed below the package covering portion, and the plurality of protruding portions are positioned to be outside of the outer boundaries of the semiconductor package placed below the package covering portion.

2. The apparatus of claim 1, wherein each package covering portion is a rectangular portion.

3. The apparatus of claim 2, wherein the rectangular portion includes the surface, and the anti-attachment portion includes one or more point-shaped, bar-shaped, or ring-shaped nodes that protrude beyond the surface of the rectangular portion.

4. The apparatus of claim 3, wherein the nodes are part of the integrated structure of the package covering portion.

5. The apparatus of claim 3, wherein the nodes are not part of the integrated structure of the package covering portion.

6. The apparatus of claim 3, wherein the anti-attachment portion includes nodes positioned at corners of the rectangular portion.

7. The apparatus of claim 6, wherein the anti-attachment portion includes four point-shaped nodes, one positioned at each corner of the rectangular portion.

8. The apparatus of claim 6, wherein the anti-attachment portion includes four bar-shaped nodes, one positioned at each corner of the rectangular portion.

9. The apparatus of claim 3, wherein the anti-attachment portion includes nodes positioned at center portions of sides of the rectangular portion.

10. The apparatus of claim 9, wherein the anti-attachment portion includes four point-shaped nodes, one positioned at a center portion of each side of the rectangular portion, or four bar-shaped nodes, one positioned at a center portion of each side of the rectangular portion.

11. The apparatus of claim 1, further comprising:
    a plurality of package loading portions disposed on the front of the tray and corresponding to the plurality of package covering portions.

12. The apparatus of claim 11, wherein:
    the tray is configured to be stacked on an identical tray, wherein one or more semiconductor packages are positioned between the tray and the identical tray.

13. The apparatus of claim 12, wherein:
    the anti-attachment portion is configured to prevent the one or more semiconductor packages from sticking to the tray when the tray is removed from the stack.

14. The apparatus of claim 1, wherein each package covering portion has a ring shape, and further comprising:
    for each package covering portion, a through hole surrounded by the package covering portion.

* * * * *